United States Patent
Akram

(10) Patent No.: US 7,112,878 B2
(45) Date of Patent: Sep. 26, 2006

(54) DIE STACKING SCHEME

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/891,792

(22) Filed: Jul. 15, 2004

(65) Prior Publication Data

US 2004/0245627 A1    Dec. 9, 2004

Related U.S. Application Data

(60) Division of application No. 10/229,968, filed on Aug. 28, 2002, now Pat. No. 6,873,036, which is a continuation of application No. 09/992,580, filed on Nov. 16, 2001, now Pat. No. 6,884,658, which is a division of application No. 09/804,421, filed on Mar. 30, 2001, now Pat. No. 6,441,483.

(51) Int. Cl.
  *H01L 23/02* (2006.01)
(52) U.S. Cl. .................. 257/686; 275/723; 275/777
(58) Field of Classification Search ............. 257/685, 257/686, 723, 724, 778
  See application file for complete search history.

(56) References Cited

U.S. PATENT DOCUMENTS

| | | | |
|---|---|---|---|
| 4,996,587 A | | 2/1991 | Hinrichsmeyer et al. |
| 5,095,402 A | * | 3/1992 | Hernandez et al. ...... 361/306.2 |
| 5,107,328 A | | 4/1992 | Kinsman |
| 5,212,402 A | | 5/1993 | Higgins, III |
| 5,247,423 A | | 9/1993 | Lin |
| 5,254,871 A | | 10/1993 | Benavides et al. |
| 5,283,717 A | | 2/1994 | Hundt |
| 5,334,875 A | | 8/1994 | Sugano et al. |
| 5,355,016 A | * | 10/1994 | Swirbel et al. ............. 257/659 |
| 5,379,189 A | | 1/1995 | Merriman |
| 5,418,752 A | | 5/1995 | Harari et al. |
| 5,444,296 A | | 8/1995 | Kaul et al. |
| 5,463,253 A | | 10/1995 | Waki et al. |
| 5,532,910 A | | 7/1996 | Suzuki et al. |
| 5,646,828 A | | 7/1997 | Degani et al. |
| 5,652,463 A | | 7/1997 | Weber et al. |

(Continued)

FOREIGN PATENT DOCUMENTS

JP    59-48949    3/1984

(Continued)

OTHER PUBLICATIONS

"Multi-Chip Module on Laminate, High-performance packaging for today's silicon," IBM Microelectronics, 1998.

*Primary Examiner*—Leonardo Andujar
(74) *Attorney, Agent, or Firm*—Dinsmore & Shohl LLP

(57) ABSTRACT

An improved die stacking scheme is provided. In accordance with one embodiment of the present invention, a multiple die semiconductor assembly is provided comprising a substrate, first and second semiconductor dies, and at least one decoupling capacitor. The first semiconductor die defines a first active surface. The first active surface includes at least one conductive bond pad. The second semiconductor die defines a second active surface, the second active surface includes at least one conductive bond pad. The first semiconductor die is interposed between the substrate and the second semiconductor die such that a surface of the second semiconductor die defines an uppermost die surface of the multiple die semiconductor assembly and such that a surface of the first semiconductor die defines a lowermost die surface of the multiple die semiconductor assembly. The decoupling capacitor is secured to the uppermost die surface and is conductively coupled to at least one of the first and second semiconductor dies.

10 Claims, 2 Drawing Sheets

U.S. PATENT DOCUMENTS

| | | | |
|---|---|---|---|
| 5,656,856 A | 8/1997 | Kweon | |
| 5,674,785 A | 10/1997 | Akram et al. | |
| 5,677,566 A | 10/1997 | King et al. | |
| 5,684,677 A | 11/1997 | Uchida et al. | |
| 5,701,033 A | 12/1997 | Ueda et al. | |
| 5,808,878 A | 9/1998 | Saito et al. | |
| 5,811,879 A | 9/1998 | Akram | |
| 5,838,546 A | 11/1998 | Miyoshi | |
| 5,898,224 A | 4/1999 | Akram | |
| 5,923,090 A | 7/1999 | Fallon et al. | |
| 5,952,611 A | 9/1999 | Eng et al. | |
| 5,969,426 A | 10/1999 | Baba | |
| 5,973,403 A | 10/1999 | Wark | |
| 5,982,038 A | 11/1999 | Toy et al. | |
| 5,994,166 A | 11/1999 | Akram et al. | |
| 5,994,773 A | 11/1999 | Hirakawa | |
| 6,005,778 A | 12/1999 | Spielberger et al. | |
| 6,013,877 A * | 1/2000 | Degani et al. | 174/264 |
| 6,013,948 A | 1/2000 | Akram et al. | |
| 6,020,629 A | 2/2000 | Farnworth et al. | |
| 6,051,878 A | 4/2000 | Akram et al. | |
| 6,069,025 A | 5/2000 | Kim | |
| 6,081,023 A | 6/2000 | Murakami et al. | |
| 6,087,717 A | 7/2000 | Ano et al. | |
| 6,093,957 A | 7/2000 | Kwon | |
| 6,093,969 A | 7/2000 | Lin | |
| 6,118,176 A | 9/2000 | Tao et al. | |
| 6,157,080 A * | 12/2000 | Tamaki et al. | 257/738 |
| 6,181,002 B1 | 1/2001 | Juso et al. | |
| 6,222,246 B1 | 4/2001 | Mak et al. | |
| 6,236,109 B1 | 5/2001 | Hsuan et al. | |
| 6,262,488 B1 | 7/2001 | Masayuki et al. | |
| 6,265,771 B1 | 7/2001 | Ference et al. | |
| 6,300,163 B1 | 10/2001 | Akram | |
| 6,303,981 B1 | 10/2001 | Moden | |
| 6,316,727 B1 | 11/2001 | Liu | |
| 6,335,566 B1 | 1/2002 | Hirashima et al. | |
| 6,337,510 B1 | 1/2002 | Chun-Jen et al. | |
| 6,344,682 B1 | 2/2002 | Tomita | |
| 6,388,336 B1 | 5/2002 | Venkateshwaran et al. | |
| 6,407,456 B1 * | 6/2002 | Ball | 257/777 |
| 6,462,412 B1 | 10/2002 | Kamei et al. | |
| 6,507,098 B1 | 1/2003 | Lo et al. | |
| 6,646,334 B1 | 11/2003 | Hur | |
| 6,707,141 B1 | 3/2004 | Akram | |
| 2001/0015485 A1 | 8/2001 | Song et al. | |
| 2002/0074668 A1 | 6/2002 | Hofstee et al. | |
| 2002/0074669 A1 | 6/2002 | Watanabe et al. | |
| 2002/0079567 A1 | 6/2002 | Lo et al. | |
| 2002/0079573 A1 | 6/2002 | Akram | |

FOREIGN PATENT DOCUMENTS

| | | |
|---|---|---|
| JP | 359111350 | 6/1984 |
| JP | 61-147559 | 7/1986 |
| JP | 02-158147 | 6/1990 |
| JP | 403096266 | 4/1991 |
| JP | 403187253 | 8/1991 |
| JP | 04-155857 | 5/1992 |
| JP | 5-343603 | 12/1993 |
| JP | 2001102512 | 4/2001 |
| JP | 2001-577215 | 5/2001 |
| JP | 02001308140 | 11/2001 |
| WO | WO 97/37374 | 10/1997 |

* cited by examiner

DIE STACKING SCHEME

CROSS-REFERENCE TO RELATED APPLICATIONS

The present application is a division of U.S. patent application Ser. No. 10/229,968 filed Aug. 28, 2002 now U.S. Pat. No. 6,873,036 (MIO 0072 NA/00-0785.02), which is a continuation of U.S. patent application Ser. No. 09/992,580 filed Nov. 16, 2001 now U.S. Pat. No. 6,884,658 (MIO 0072 VA/00-0785.01), which is a division of U.S. patent application Ser. No. 09/804,421 filed Mar. 30, 2001, now U.S. Pat. No. 6,441,483 (MIO 0072 PA/00-0785.00). This application is also related to U.S. patent application Ser. No. 10/796,246 (MIO 0069 VA/99-1058.01), which is a division of U.S. patent application Ser. No. 09/804,051 (MIO 0069 PA/99-1058.00). This application is further related to U.S. patent application Ser. No. 10/229,969 (MIO 0080 VA/99-1053.01), which is a division of U.S. patent application Ser. No. 09/855,731, now U.S. Pat. No. 6,507,107 (MIO 0080 PA/99-1053.00).

BACKGROUND OF THE INVENTION

The present invention relates to stacked multiple die semiconductor assemblies, printed circuit board assemblies, computer systems, and their methods of assembly. More particularly, the present invention relates to an improved scheme for increasing semiconductor die density.

Conventional Chip On Board (COB) techniques used to attach semiconductor dies to a printed circuit board include flip chip attachment, wirebonding, and tape automated bonding ("TAB"). Flip chip attachment consists of attaching a flip chip to a printed circuit board or other substrate. A flip chip is a semiconductor chip that has a pattern or array of electrical terminations or bond pads spaced around an active surface of the flip chip for face down mounting of the flip chip to a substrate. Generally, the flip chip has an active surface having one of the following electrical connectors: Ball Grid Array ("BGA")—wherein an array of minute solder balls is disposed on the surface of a flip chip that attaches to the substrate ("the attachment surface"); Slightly Larger than Integrated Circuit Carrier ("SLICC")—which is similar to a BGA, but having a smaller solder ball pitch and diameter than a BGA; or a Pin Grid Array ("PGA")—wherein an array of small pins extends substantially perpendicularly from the attachment surface of a flip chip. The pins conform to a specific arrangement on a printed circuit board or other substrate for attachment thereto.

With the BGA or SLICC, the solder or other conductive ball arrangement on the flip chip must be a mirror-image of the connecting bond pads on the printed circuit board such that precise connection is made. The flip chip is bonded to the printed circuit board by refluxing the solder balls. The solder balls may also be replaced with a conductive polymer. With the PGA, the pin arrangement of the flip chip must be a mirror-image of the pin recesses on the printed circuit board. After insertion, the flip chip is generally bonded by soldering the pins into place. An under-fill encapsulant is generally disposed between the flip chip and the printed circuit board for environmental protection and to enhance the attachment of the flip chip to the printed circuit board. A variation of the pin-in-recess PGA is a J-lead PGA, wherein the loops of the J's are soldered to pads on the surface of the circuit board.

Wirebonding and TAB attachment generally begin with attaching a semiconductor chip to the surface of a printed circuit board with an appropriate adhesive, such as an epoxy. In wirebonding, bond wires are attached, one at a time, to each bond pad on the semiconductor chip and extend to a corresponding lead or trace end on the printed circuit board. The bond wires are generally attached through one of three industry-standard wirebonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts. The semiconductor chip may be oriented either face up or face down (with its active surface and bond pads either up or down with respect to the circuit board) for wire bonding, although face up orientation is more common. With TAB, ends of metal leads carried on an insulating tape such as a polyamide are respectively attached to the bond pads on the semiconductor chip and to the lead or trace ends on the printed circuit board. An encapsulant is generally used to cover the bond wires and metal tape leads to prevent contamination.

Higher performance, lower cost, increased miniaturization of components, and greater packaging density of integrated circuits are ongoing goals of the computer industry. As new generations of integrated circuit products are released, the number of devices used to fabricate them tends to decrease due to advances in technology even though the functionality of these products increases. For example, on the average, there is approximately a 10 percent decrease in components for every product generation over the previous generation with equivalent functionality.

In integrated circuit packaging, in addition to component reduction, surface mount technology has demonstrated an increase in semiconductor chip density on a single substrate or board despite the reduction of the number of components. This results in more compact designs and form factors and a significant increase in integrated circuit density. However, greater integrated circuit density is primarily limited by the space or "real estate" available for mounting dies on a substrate, such as a printed circuit board.

U.S. Pat. Nos. 5,994,166 and 6,051,878, the disclosures of which are incorporated herein by reference, represent a number of schemes for increasing semiconductor chip density on a single substrate or board. Despite the advantages of the most recent developments in semiconductor fabrication there is a continuing need for improved schemes for increasing semiconductor die density in printed circuit board assemblies.

BRIEF SUMMARY OF THE INVENTION

This need is met by the present invention wherein an improved die stacking scheme is provided. In accordance with one embodiment of the present invention, a multiple die semiconductor assembly is provided comprising a substrate and first and second semiconductor dies. The first semiconductor die includes a pair of major surfaces. One of the pair of major surfaces of the first die defines a first active surface. The other of the major surfaces of the first die defines a first stacking surface. The first active surface includes at least one conductive bond pad. The first stacking surface is secured to the substrate. The second semiconductor die includes a pair of major surfaces. One of the pair of major surfaces of the second die defines a second active surface. The other of the major surfaces of the second die defines a second stacking surface. The second active surface includes at least one conductive bon pad. The first semiconductor die is electrically coupled to the second semiconductor die by at least one topographic contact extending from a conductive bond pad on the second active surface to a conductive bond pad on the first active surface.

In accordance with another embodiment of the present invention, a multiple die semiconductor assembly is provided comprising a substrate and first and second semiconductor dies. The substrate includes a first surface and conductive contacts included on the first surface. The first semiconductor die includes a pair of major surfaces. One of the pair of major surfaces of the first die defines a first active surface. The other of the major surfaces of the first die defines a first stacking surface. The first active surface includes at least one conductive bond pad. The first stacking surface is secured to the first surface of the substrate. The second semiconductor die includes a pair of major surfaces. One of the pair of major surfaces of the second die defines a second active surface. The other of the major surfaces of the second die defines a second stacking surface. The second active surface includes at least one conductive bond pad. The first semiconductor die is electrically coupled to the second semiconductor die by at least one topographic contact extending from a conductive bond pad on the second active surface to a conductive bond pad on the first active surface. At least one conductive line extends from a bond pad on the first active surface to a conductive contact on the first surface of the substrate.

In accordance with yet another embodiment of the present invention, a multiple die semiconductor assembly is provided comprising a substrate and first and second semiconductor dies. The first semiconductor die includes a pair of major surfaces. One of the pair of major surfaces of the first die defines a first active surface. The other of the major surfaces of the first die defines a first stacking surface. The first active surface includes at least one conductive bond pad. The first active surface is electrically coupled to the substrate by at least one topographic contact extending from a conductive bond pad on the first active surface to a conductive contact on the substrate. The second semiconductor die includes a pair of major surfaces. One of the pair of major surfaces of the second die defines a second active surface. The other of the major surfaces of the second die defines a second stacking surface. The second active surface includes at least one conductive bond pad. The first stacking surface is secured to the second stacking surface.

In accordance with yet another embodiment of the present invention, a multiple die semiconductor assembly is provided comprising a substrate and first and second semiconductor dies. The substrate includes a first surface and conductive contacts included on the first surface. The first semiconductor die includes a pair of major surfaces. One of the pair of major surfaces of the first die defines a first active surface. The other of the major surfaces of the first die defines a first stacking surface. The first active surface includes at least one conductive bond pad. The first active surface is electrically coupled to the substrate by at least one topographic contact extending from a conductive bond pad on the first active surface to a conductive contact on the first surface of the substrate. The second semiconductor die includes a pair of major surfaces. One of the pair of major surfaces of the second die defines a second active surface. The other of the major surfaces of the second die defines a second stacking surface. The second active surface includes at least one conductive bond pad. The first stacking surface is secured to the second stacking surface. At least one conductive line extends from a bond pad on the second active surface to a conductive contact on the first surface of the substrate.

In accordance with yet another embodiment of the present invention, a multiple die semiconductor assembly is provided comprising a substrate, first and second semiconductor dies, and at least one decoupling capacitor. The first semiconductor die defines a first active surface. The first active surface includes at least one conductive bond pad. The second semiconductor die defines a second active surface, the second active surface includes at least one conductive bond pad. The first semiconductor die is interposed between the substrate and the second semiconductor die such that a surface of the second semiconductor die defines an uppermost die surface of the multiple die semiconductor assembly and such that a surface of the first semiconductor die defines a lowermost die surface of the multiple die semiconductor assembly. The decoupling capacitor is secured to the uppermost die surface and is conductively coupled to at least one of the first and second semiconductor dies.

In accordance with yet another embodiment of the present invention, a multiple die semiconductor assembly is provided comprising a substrate, first and second semiconductor dies, and at least one decoupling capacitor. The first semiconductor die is positioned adjacent the substrate relative to the cross section. The second semiconductor die is positioned adjacent the first semiconductor die relative to the cross section. The first semiconductor die is interposed between the substrate and the second semiconductor die relative to the cross section. The decoupling capacitor is positioned adjacent the second semiconductor die relative to the cross section and is secured to the second semiconductor die. The second semiconductor die is interposed between the decoupling capacitor and the first semiconductor die relative to the cross section.

In accordance with yet another embodiment of the present invention, a printed circuit board assembly is provided comprising a substrate, first and second semiconductor dies, and a printed circuit board. The first semiconductor die includes a pair of major surfaces. One of the pair of major surfaces of the first die defines a first active surface. The other of the major surfaces of the first die defines a first stacking surface. The first active surface includes at least one conductive bond pad. The first stacking surface is secured to the substrate. The second semiconductor die includes a pair of major surfaces. One of the pair of major surfaces of the second die defines a second active surface. The other of the major surfaces of the second die defines a second stacking surface. The second active surface includes at least one conductive bond pad. The first semiconductor die is electrically coupled to the second semiconductor die by at least one topographic contact extending from a conductive bond pad on the second active surface to a conductive bond pad on the first active surface. The printed circuit board is positioned such that a first surface of the printed circuit board faces the substrate. A plurality of topographic contacts extend from the substrate to the first surface of the printed circuit board.

In accordance with yet another embodiment of the present invention, a printed circuit board assembly is provided comprising a substrate, first and second semiconductor dies, and a printed circuit board. The first semiconductor die includes a pair of major surfaces. One of the pair of major surfaces of the first die defines a first active surface. The other of the major surfaces of the first die defines a first stacking surface. The first active surface includes at least one conductive bond pad. The first active surface is electrically coupled to the substrate by at least one topographic contact extending from a conductive bond pad on the first active surface to a conductive contact on the substrate. The second semiconductor die includes a pair of major surfaces. One of the pair of major surfaces of the second die defines a second active surface. The other of the major surfaces of the second die defines a second stacking surface. The second active surface includes at least one conductive bond pad. The first stacking surface is secured to the second stacking surface. The printed circuit board is positioned such that a first surface of the printed circuit board faces the substrate. A plurality of topographic contacts extend from the substrate to the first surface of the printed circuit board.

In accordance with yet another embodiment of the present invention, a computer system is provided comprising a programmable controller and at least one memory unit. The memory unit comprises a printed circuit board assembly according to the present invention.

In accordance with yet another embodiment of the present invention, a method of stacking a plurality of semiconductor die is provided. The method comprises the steps of: providing a substrate; providing a first semiconductor die including a pair of major surfaces, wherein one of the pair of major surfaces of the first die defines a first active surface, the other of the major surfaces of the first die defines a first stacking surface, and the first active surface includes at least one conductive bond pad; securing the first stacking surface to the substrate; providing a second semiconductor die including a pair of major surfaces, wherein one of the pair of major surfaces of the second die defines a second active surface, the other of the major surfaces of the second die defines a second stacking surface, and the second active surface includes at least one conductive bond pad; electrically coupling the first semiconductor die to the second semiconductor die with at least one topographic contact extending from a conductive bond pad on the second active surface to a conductive bond pad on the first active surface.

In accordance with yet another embodiment of the present invention, a method of stacking a plurality of semiconductor die is provided. The method comprises the steps of: providing a substrate; providing a first semiconductor die including a pair of major surfaces, wherein one of the pair of major surfaces of the first die defines a first active surface, the other of the major surfaces of the first die defines a first stacking surface, and the first active surface includes at least one conductive bond pad; electrically coupling the first active surface to the substrate with at least one topographic contact extending from a conductive bond pad on the first active surface to a conductive contact on the substrate; providing a second semiconductor die including a pair of major surfaces, wherein one of the pair of major surfaces of the second die defines a second active surface, the other of the major surfaces of the second die defines a second stacking surface, and the second active surface includes at least one conductive bond pad; and securing the first stacking surface to the second stacking surface.

In accordance with yet another embodiment of the present invention, a method of stacking a plurality of semiconductor die is provided. The method comprises the steps of: providing a substrate; providing a first semiconductor die defining a first active surface, the first active surface including at least one conductive bond pad; providing a second semiconductor die defining a second active surface, the second active surface including at least one conductive bond pad; interposing the first semiconductor die between the substrate and the second semiconductor die such that a surface of the second semiconductor die defines an uppermost die surface of the multiple die semiconductor assembly and such that a surface of the first semiconductor die defines a lowermost die surface of the multiple die semiconductor assembly; securing at least one decoupling capacitor to the uppermost die surface; and conductively coupling the decoupling capacitor to at least one of the first and second semiconductor dies.

In accordance with yet another embodiment of the present invention, a method of stacking a plurality of semiconductor die along a cross section is provided. The method comprises the steps of: providing a substrate; positioning a first semiconductor die adjacent the substrate relative to the cross section; positioning a second semiconductor die adjacent the first semiconductor die relative to the cross section; interposing the first semiconductor die between the substrate and the second semiconductor die relative to the cross section; positioning at least one decoupling capacitor adjacent the second semiconductor die relative to the cross section; securing the decoupling capacitor to the second semiconductor die; and interposing the second semiconductor die is between the decoupling capacitor and the first semiconductor die relative to the cross section.

In accordance with yet another embodiment of the present invention, a method of assembling a printed circuit board is provided. The method comprises the steps of: providing a substrate including first and second surfaces and conductive contacts included on the first surface; providing a first semiconductor die including a pair of major surfaces, wherein one of the pair of major surfaces of the first die defines a first active surface, the other of the major surfaces of the first die defines a first stacking surface, the first active surface includes a plurality of conductive bond pads, and the first stacking surface is devoid of conductive bond pads; securing the first stacking surface to the first surface of the substrate between the conductive contacts included on the first surface of the substrate; providing a second semiconductor die including a pair of major surfaces, wherein one of the pair of major surfaces of the second die defines a second active surface, the other of the major surfaces of the second die defines a second stacking surface, and the second active surface includes a plurality of conductive bond pads; electrically coupling the first semiconductor die to the second semiconductor die with a plurality of topographic contacts extending from respective conductive bond pads on the second active surface to a corresponding conductive bond pad on the first active surface; securing a single decoupling capacitor to the second stacking surface; providing a pair of conductive lines, each of the conductive lines connecting a terminal of the decoupling capacitor, a bond pad on the first active surface, and a conductive contact on the first surface of the substrate; electrically coupling the bond pad on the first active surface to the second semiconductor die via one of the plurality of topographic contacts extending from respective conductive bond pads on the second active surface to a corresponding conductive bond pad on the first active surface; arranging the pair of conductive lines such that the decoupling capacitor is connected across $V_{ss}$ and $V_{cc}$ pins of the first and second semiconductor dies; positioning a printed circuit board such that a first surface of the printed circuit board faces the substrate; and providing a plurality of topographic contacts extending from the second surface of the substrate to the first surface of the printed circuit board.

In accordance with yet another embodiment of the present invention, a method of assembling a printed circuit board is provided. The method comprises the steps of: providing a substrate including a first surface and conductive contacts included on the first surface; providing a first semiconductor die including a pair of major surfaces, wherein one of the pair of major surfaces of the first die defines a first active surface, the other of the major surfaces of the first die defines a first stacking surface, and the first active surface includes a plurality of conductive bond pads; electrically coupling the first active surface to the substrate with a plurality of topographic contacts extending from respective conductive bond pads on the first active surface to corresponding conductive contacts on the first surface of the substrate; providing a second semiconductor die including a pair of major surfaces, wherein one of the pair of major surfaces of the second die defines a second active surface, the other of the major surfaces of the second die defines a second stacking surface, the second active surface includes a plurality of conductive bond pads, and the first stacking surface is devoid of conductive bond pads; securing the first stacking surface to the second stacking surface; securing a single decoupling capacitor to the second stacking surface; providing a pair of conductive lines, each of the conductive lines connecting a terminal of the decoupling capacitor, a bond pad on the second active surface, and a conductive contact on the first surface of the substrate; electrically coupling the conductive contact on the first surface of the substrate to the first semiconductor die via one of the plurality of topographic contacts extending from respective conductive bond pads on the first active surface to corresponding conductive contacts on the first surface of the substrate; arranging the pair of conductive lines such that the decoupling capacitor is connected across $V_{ss}$ and $V_{cc}$ pins of the first and second semiconductor dies; positioning a printed circuit board such that a first surface of the printed circuit board faces the substrate; and providing a plurality of topographic contacts extending from the substrate to the first surface of the printed circuit board.

Accordingly, it is an object of the present invention to provide an improved die stacking scheme. Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals and in which.

DETAILED DESCRIPTION

Figure 1:
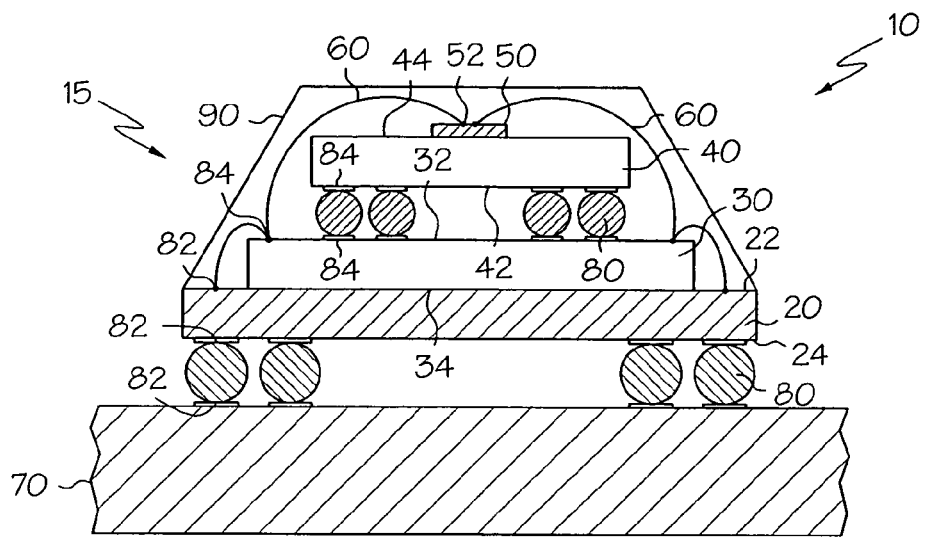
FIG. 1 presents an illustration of a die stacking scheme according to one embodiment of the present invention.

Referring initially to FIG. 1, a die stacking scheme according to one embodiment of the present invention is illustrated. FIG. 1 illustrates a printed circuit board assembly 10. The printed circuit board assembly 10 includes a multiple die semiconductor assembly 15 and a printed circuit board 70. The multiple die semiconductor assembly 15 comprises a substrate 20, a first semiconductor die 30, a second semiconductor die 40, a decoupling capacitor 50, conductive lines 60, a plurality of topographic contacts 80, and an encapsulant 90. It is noted that the encapsulant 90 and the semiconductor dies 30, 40 are not illustrated in cross section in FIGS. 1 and 2 to preserve clarity.

The substrate 20 includes a first surface 22 and a second surface 24. Conductive contacts 82 are included on the first surface 22 and the second surface 24. The topographic contacts 80 extend from the conductive contacts 82 on the first and second surfaces 22, 24 of the substrate 20. For the purposes of defining and describing the present invention, it is noted that a topographic contact comprises any conductive contact that extends between and defines a spacing between an active surface of a substrate or die and an active surface of another substrate or die. Examples include solder balls, conductive polymers, or other types of topographic electrical connections. A pin grid array, where pin recesses are provided in the opposing surface, present a suitable alternative to topographic contacts, where it is not necessary to create a spacing between two surfaces for accommodating structure there between.

The first semiconductor die 30 also includes a pair of major surfaces one of which defines a first active surface 32. The remaining major surface of the first die 30 defines a first stacking surface 34. The first active surface 32 includes a plurality of conductive bond pads 84. The first stacking surface 34 is devoid of conductive bond pads and is secured to the first surface 22 of the substrate 20 between the conductive contacts 82 included on the first surface 22 of the substrate 20. The first semiconductor die 30 may be secured to the substrate 20 via a layer of die attach adhesive interposed between the substrate 20 and the first semiconductor die 30. For the purposes of defining and describing the present invention, a stacking surface comprises a major surface of a substrate or die that is arranged to be secured to a substrate or other generally planar assembly component. For example, a semiconductor die may be secured to a surface of a substrate by interposing a layer of die attach adhesive between the stacking surface of the die and the surface of the substrate.

For the purposes of describing and defining the present invention, it is noted that a conductive bond pad comprises a conductive surface area defined on or extending from a surface of a semiconductor die. A conductive contact comprises a conductive surface area defined on or extending from a substrate. An active surface comprises a surface of a die or substrate that contains conductive contacts or conductive bond pads.

The second semiconductor die 40 also includes a pair of major surfaces, one of which defines a second active surface 42. The remaining major surface of the second die 40 defines a second stacking surface 44. The second active surface 42 includes a plurality of conductive bond pads 84. The first semiconductor die 30 is electrically coupled to the second semiconductor die 40 by the topographic contacts 80, which extend from respective conductive bond pads 84 on the second active surface 42 to a corresponding conductive bond pad 84 on the first active surface 32. The decoupling capacitor 50 is secured to the second stacking surface 44.

Each of the pair of conductive lines 60 illustrated in FIG. 1 electrically connect a terminal 52 of the decoupling capacitor 50, a bond pad 84 on the first active surface 32, and a conductive contact 82 on the first surface 22 of the substrate 20. The bond pad 84 on the first active surface 32 is electrically coupled to the second semiconductor die 40 via a conductive line (not shown) and one of the topographic contacts 80 extending from a conductive bond pads 84 on the second active surface 42 to a corresponding conductive bond pad 84 on the first active surface 32. In this manner, the pair of conductive lines 60 are arranged such that the decoupling capacitor may be connected across $V_{ss}$ and $V_{cc}$ pins or terminals (i.e., the high and low voltage inputs) of the first and second semiconductor dies 30, 40. It is noted that a conductive line may comprise an electrically conductive lead, trace, bond wire, etc. In this manner, the decoupling capacitors decouple the low voltage input from the high voltage input and serves as a power source filter or surge/spike suppressor.

As will be appreciated by those practicing the present invention, the conductive contacts, which may embody printed conductive lines, wires, traces, and combinations thereof, electrically couple the various components of the printed circuit board assembly to the printed circuit board and to each other. For the purposes of defining and describing the present invention when reference is made herein to electrical coupling to a substrate or other structure, it is understood that the electrical coupling includes electrical coupling to a contact on a surface of the substrate or other structure. It is also noted that electrical coupling need not be direct and may include coupling through one or more circuitry components.

The printed circuit board 70 is positioned such that a first surface 72 of the printed circuit board 70 faces the substrate 20. A plurality of topographic contacts 80 extend from the second surface 24 of the substrate 20 to the first surface 72 of the printed circuit board 70 to electrically couple the multiple die semiconductor assembly 15 to the printed circuit board 70. For the purposes of describing and defining the present invention, it is noted that a printed circuit board comprises a substrate upon which a circuit, network, or plurality of electrically conductive areas are formed.

Typically, the multiple die semiconductor assembly 15 is packaged with an encapsulant 90. Portions of the assembly may be provided with underfill material and other packaging materials, according to conventional die packaging methodology. As will be appreciated by those familiar with semiconductor fabrication, underfill materials are generally disposed between a die and the printed circuit board or substrate to which it is mounted for environmental protection and to enhance the attachment of the die to the printed circuit board or substrate. A die attach adhesive may be positioned to secure a die to a surface of an adjacent object and to secure an object to a surface of a die.

Figure 2:
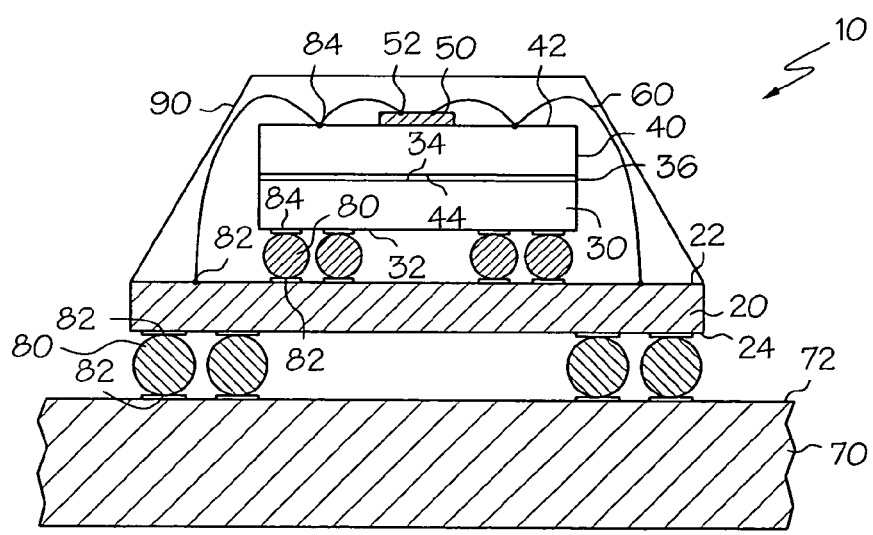
FIG. 2 presents an illustration of a die stacking scheme according to another embodiment of the present invention.
Figure 3:
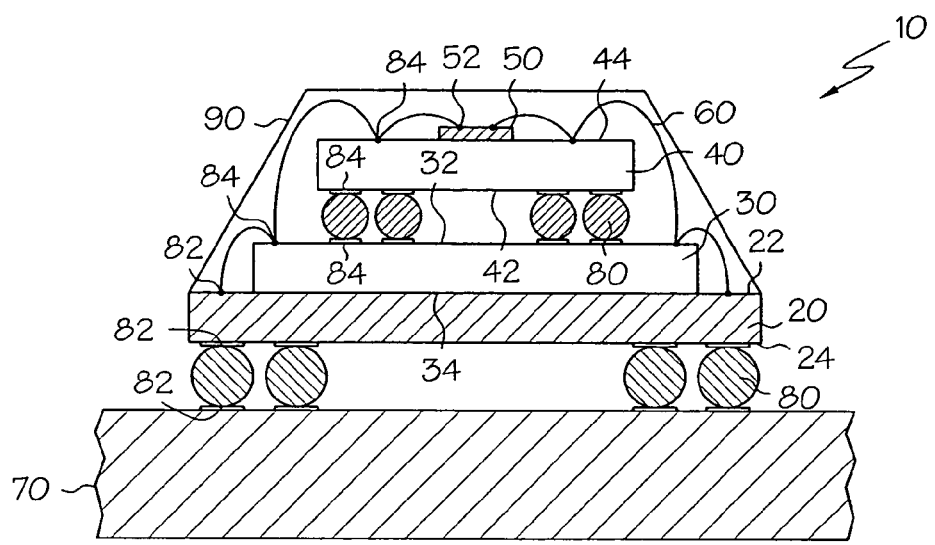
FIG. 3 presents an illustration of a die stacking scheme according to yet another embodiment of the present invention.

In the embodiment of the present invention illustrated in FIG. 2, where like structure is indicated with like reference numerals, the first active surface 32 is electrically coupled to the substrate 20 by a plurality of topographic contacts 80 extending from respective conductive bond pads 84 on the first active surface 32 to corresponding conductive contacts 82 on the first surface 22 of the substrate 20. The first stacking surface 34 is devoid of conductive bond pads 84 and is secured to the second stacking surface 44 with a die attach adhesive 36. The decoupling capacitor 50 is secured to the second active surface 42 with, for example, a die attach adhesive (not shown). As is noted above with reference to the embodiment of FIG. 1, the pair of conductive lines 60 are arranged such that the decoupling capacitor is connected across $V_{ss}$ and $V_{cc}$ pins or terminals (i.e., the high and low voltage inputs) of the first and second semiconductor dies. The embodiment of FIG. 3 differs from that illustrated in FIG. 1 because both surfaces of the second semiconductor die 40 comprise active surfaces 42 and include conductive bond pads 84.

Figure 4:
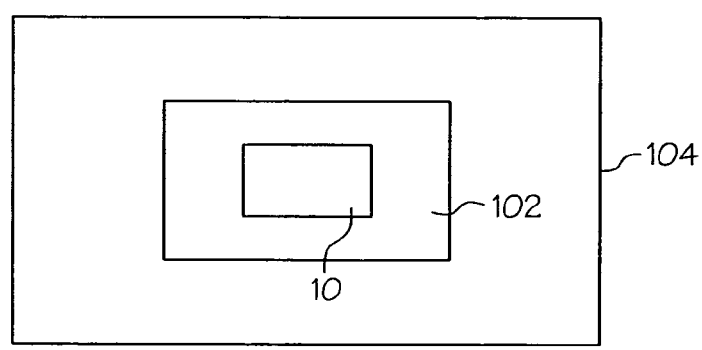
FIG. 4 presents a schematic illustration of a computer system in accordance with an embodiment of the present invention.

Conventional stacking, soldering, bonding, under filling, encapsulating, curing, and other semiconductor processing techniques may be modified and arranged to yield the various stacked structures of the present invention. The particular fabrication steps for assembling the various embodiments of the present invention may be gleaned from conventional semiconductor die stacking and packaging technology and the detailed description of the illustrated embodiments herein. For the purposes of defining the assembly scheme of the present invention it is noted that any claims to a method of assembling a structure are not intended to be limited by the order in which specific process steps are recited in a claim. As will be appreciated by those practicing the present invention, the printed circuit board assembly of the present invention is typically provided as part of a computer system 104, as illustrated in FIG. 4. In specific applications of the present invention, the semiconductor dies may form an integrated memory unit but may embody a variety of alternative integrated circuit functions. For example, a memory unit 102 may comprise the printed circuit board assembly 10 of the present invention, and the memory unit 102 may be incorporated into a computer system 104.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A multiple semiconductor die assembly comprising:
    a substrate including at least one conductive contact;
    a first semiconductor die defining a first active surface, said first active surface secured to said substrate by at least one contact;
    a second semiconductor die defining a second active surface, said second semiconductor die secured to said first semiconductor die;
    a decoupling capacitor secured to said second active surface of said second semiconductor die;
    at least one conductive line extending from said decoupling capacitor, said second active surface, and one of said at least one conductive contacts on said substrate; and
    an encapsulant formed over at least a portion of said first semiconductor die, at least a portion of said second semiconductor die, at least a portion of said decoupling capacitor, and at least a portion of said substrate.

2. A printed circuit board assembly comprising:
    a substrate including at least one conductive contact;
    a first semiconductor die defining a first active surface, said first active surface secured to said substrate by at least one contact;
    a second semiconductor die defining a second active surface, said second semiconductor die secured to said first semiconductor die;
    a decoupling capacitor secured to said second active surface of said second semiconductor die;
    at least one conductive line extending from said decoupling capacitor, said second active surface, and one of said at least one conductive contacts on said substrate; and
    a printed circuit board positioned such that a first surface of said printed circuit board faces said substrate, wherein said printed circuit board is secured to said substrate by at least one conductive contact.

3. A computer system comprising a programmable controller and at least one memory unit, wherein said memory unit comprises a printed circuit board assembly comprising:
 a substrate including at least one conductive contact;
 a first semiconductor die defining a first active surface, said first active surface secured to said substrate by at least one contact;
 a second semiconductor die defining a second active surface, said second semiconductor die secured to said first semiconductor die;
 a decoupling capacitor secured to said second active surface of said second semiconductor die;
 at least one conductive line extending from said decoupling capacitor, said second active surface, and one of said at least one conductive contacts on said substrate; and
 a printed circuit board positioned such that a first surface of said printed circuit board faces said substrate, wherein said printed circuit board is secured to said substrate by at least one conductive contact.

4. A multiple semiconductor die assembly comprising:
 a substrate including at least one conductive contact;
 a first semiconductor die defining a first active surface including at least one bond pad, said first active surface secured to said substrate by at least one topographic contact extending from one of said at least one conductive contacts to one of said at least one bond pads on said first active surface;
 a second semiconductor die defining a second active surface, said second semiconductor die secured to said first semiconductor die;
 a decoupling capacitor secured to said second active surface of said second semiconductor die;
 at least one conductive line extending from said decoupling capacitor, one of said at least one bond pads on said second active surface, and one of said at least one conductive contacts on said substrate; and
 an encapsulant formed over at least a portion of said first semiconductor die, at least a portion of said second semiconductor die, at least a portion of said decoupling capacitor, and at least a portion of said substrate.

5. A multiple die semiconductor assembly as claimed in claim 4 wherein said first semiconductor die is secured to said substrate by a least one conductive contact.

6. A multiple die semiconductor assembly as claimed in claim 5 wherein said conductive contact is electrically coupled to said first semiconductor die.

7. A printed circuit board assembly comprising:
 a substrate including at least one conductive contact;
 a first semiconductor die defining a first active surface including at least one bond pad, said first active surface secured to said substrate by at least one topographic contact extending from one of said at least one conductive contacts to one of said at least one bond pads on said first active surface;
 a second semiconductor die defining a second active surface, said second semiconductor die secured to said first semiconductor die;
 a decoupling capacitor secured to said second active surface of said second semiconductor die;
 at least one conductive line extending from said decoupling capacitor, one of said at least one bond pads on said second active surface, and one of said at least one conductive contacts on said substrate; and
 a printed circuit board positioned such that a first surface of said printed circuit board faces said substrate, wherein said printed circuit board is coupled to said substrate by at least one topographic contact extending from said substrate to said first surface of said printed circuit board.

8. A printed circuit board assembly as claimed in claim 7 wherein said conductive line is external to said substrate, said first semiconductor die, and said second semiconductor die.

9. A computer system comprising a programmable controller and at least one memory unit, wherein said memory unit comprises a printed circuit board assembly comprising:
 a substrate including at least one conductive contact;
 a first semiconductor die defining a first active surface including at least one bond pad, said first active surface secured to said substrate by at least one topographic contact extending from one of said at least one conductive contacts to one of said at least one bond pads on said first active surface;
 a second semiconductor die defining a second active surface, said second semiconductor die secured to said first semiconductor die;
 a decoupling capacitor secured to said second active surface of said second semiconductor die;
 at least one conductive line extending from said decoupling capacitor, one of said at least one bond pads on said second active surface, and one of said at least one conductive contacts on said substrate; and
 a printed circuit board positioned such that a first surface of said printed circuit board faces said substrate, wherein said printed circuit board is coupled to said substrate by at least one topographic contact extending from said substrate to said first surface of said printed circuit board.

10. A computer system as claimed in claim 9 wherein said conductive line is external to said substrate, said first semiconductor die, and said second semiconductor die.

* * * * *